(12) United States Patent
Pang et al.

(10) Patent No.: US 9,673,412 B2
(45) Date of Patent: Jun. 6, 2017

(54) SYSTEM AND METHOD FOR MATCHING ELECTRODE RESISTANCES IN OLED LIGHT PANELS

(71) Applicant: Universal Display Corporation, Ewing, NJ (US)

(72) Inventors: Huiqing Pang, Bellevue, WA (US); Ruiqing Ma, Morristown, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 14/852,072

(22) Filed: Sep. 11, 2015

(65) Prior Publication Data
US 2015/0380672 A1 Dec. 31, 2015

Related U.S. Application Data

(62) Division of application No. 13/713,072, filed on Dec. 13, 2012, now Pat. No. 9,159,945.

(51) Int. Cl.
*H01L 29/08* (2006.01)
*H01L 51/50* (2006.01)
(Continued)

(52) U.S. Cl.
CPC ........... *H01L 51/5056* (2013.01); *H01J 1/62* (2013.01); *H01L 51/0021* (2013.01); *H01L 51/506* (2013.01); *H01L 51/5203* (2013.01); *H01L 51/5209* (2013.01); *H01L 51/5225* (2013.01); *H01L 51/56* (2013.01); *H01L 51/5004* (2013.01); *H01L 51/5206* (2013.01); *H01L 51/5221* (2013.01); *H01L 2251/5361* (2013.01); *H01L 2251/55* (2013.01); *H01L 2251/558* (2013.01); *H01L 2251/56* (2013.01)

(58) Field of Classification Search
CPC ......... H01L 51/50; H01L 51/5203; H01J 1/62
USPC ................................ 257/40, 79; 313/35.506
See application file for complete search history.

(56) References Cited

U.S. PATENT DOCUMENTS 4,769,292 A  9/1988  Tang et al.
5,247,190 A  9/1993  Friend et al.
(Continued)

FOREIGN PATENT DOCUMENTS

WO  2008057394  5/2008
WO  2010011390  1/2010

OTHER PUBLICATIONS

Baldo, et al., "Highly efficient phosphorescent emission from organic electroluminescent devices", Nature, vol. 395, pp. 151-154, 1998.
(Continued)

*Primary Examiner* — Long K Tran
(74) *Attorney, Agent, or Firm* — Morris & Kamlay LLP

(57) ABSTRACT

Provided are an OLED device and a method of manufacturing the OLED device that may provide improved luminance uniformity. The disclosed OLED may have a first electrode that has a first sheet resistance Rs, and a second electrode that has a second sheet resistance, wherein the second sheet resistance may be in the range of 0.3 Rs-1.3 Rs. In addition, the disclosed OLED may have a plurality of equal potential difference between points on a first electrode and a second electrode. The equal potential difference may be provided by a gradient resistance formed on at least one of the electrodes.

16 Claims, 18 Drawing Sheets

(51) Int. Cl.
*H01L 51/52* (2006.01)
*H01J 1/62* (2006.01)
*H01L 51/00* (2006.01)
*H01L 51/56* (2006.01)

(56) References Cited

U.S. PATENT DOCUMENTS

| | | |
|---|---|---|
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |
| 6,664,137 B2 | 12/2003 | Weaver |
| 7,279,704 B2 | 10/2007 | Walters et al. |
| 7,431,968 B1 | 10/2008 | Shtein et al. |
| 7,968,146 B2 | 6/2011 | Wagner et al. |
| 8,796,919 B2 | 8/2014 | Matsubayashi et al. |
| 2002/0055704 A1 | 5/2002 | Scott et al. |
| 2003/0230980 A1 | 12/2003 | Forrest et al. |
| 2004/0174116 A1 | 9/2004 | Lu et al. |
| 2006/0261732 A1* | 11/2006 | Miller ................. H01L 27/3216 313/504 |
| 2007/0018568 A1 | 1/2007 | Nagara et al. |
| 2007/0035236 A1* | 2/2007 | Murano ............. H01L 51/5203 313/504 |
| 2008/0197371 A1 | 8/2008 | Ottermann |
| 2010/0294351 A1 | 11/2010 | Holmes et al. |
| 2010/0301368 A1* | 12/2010 | Im ....................... H01L 51/5218 257/98 |
| 2012/0146485 A1 | 6/2012 | Matsubayashi et al. |

OTHER PUBLICATIONS

Baldo, et al., "Very high-efficiency green organic light-emitting devices based on electrophosphorescence", Applied Physics Letters, vol. 75, No. 1, pp. 4-6, Jul. 5, 1999.

Ma, et al., "Challenges and Opportunities in Scaling Up OLED Lighting Devices", SID 2011, Los Angeles, 2011.

Park, et al., "Optical and thermal properties of large-area OLED lightings with metallic grids", Organic Electronics, 13 (2012) 184-194, 2012.

Poppe, et al., "Methodology for Thermal and Electrical Characterization of Large Area OLEDs", 25th IEEE SEMI-THERM Symposium, 2009.

* cited by examiner

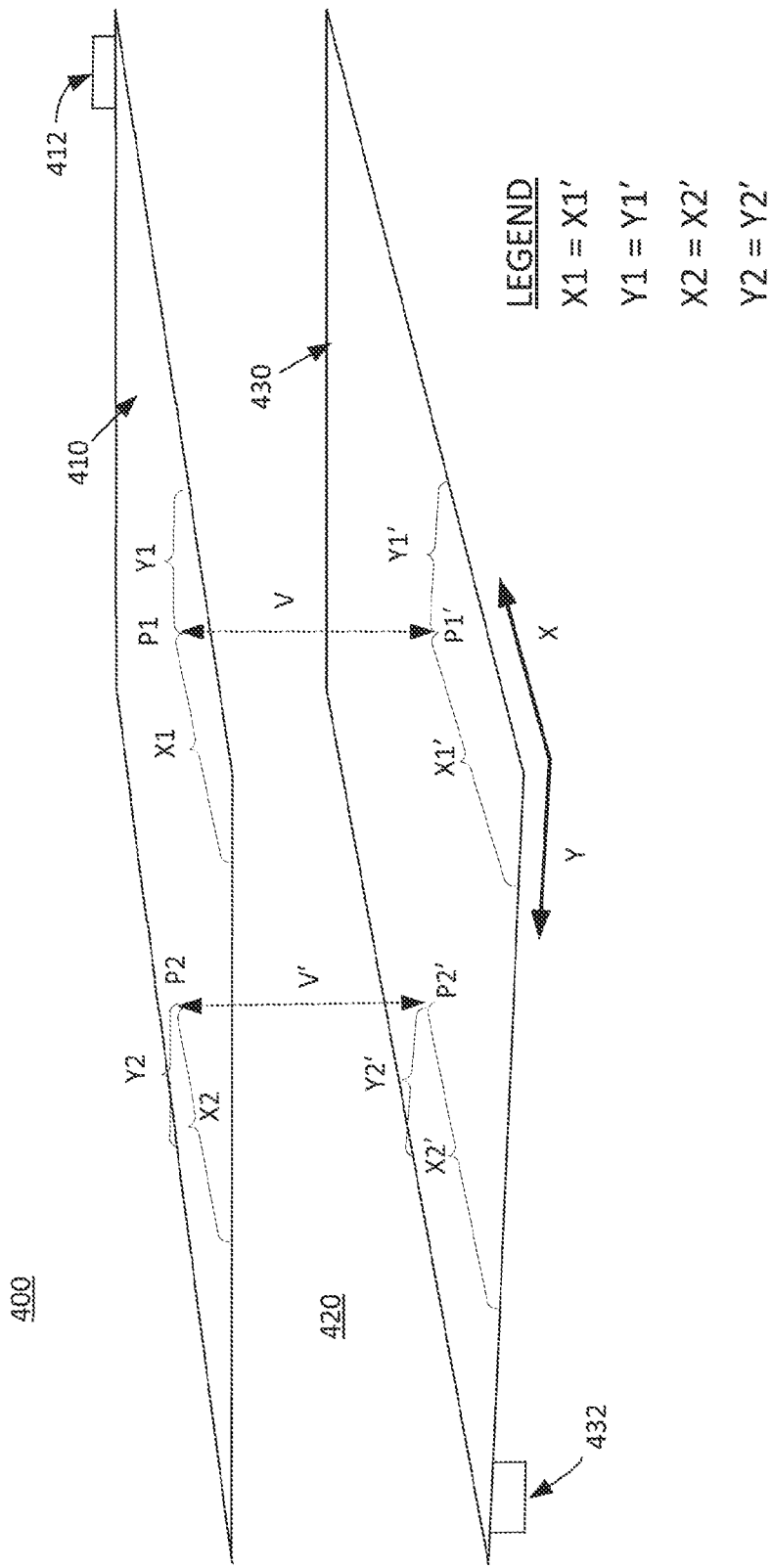

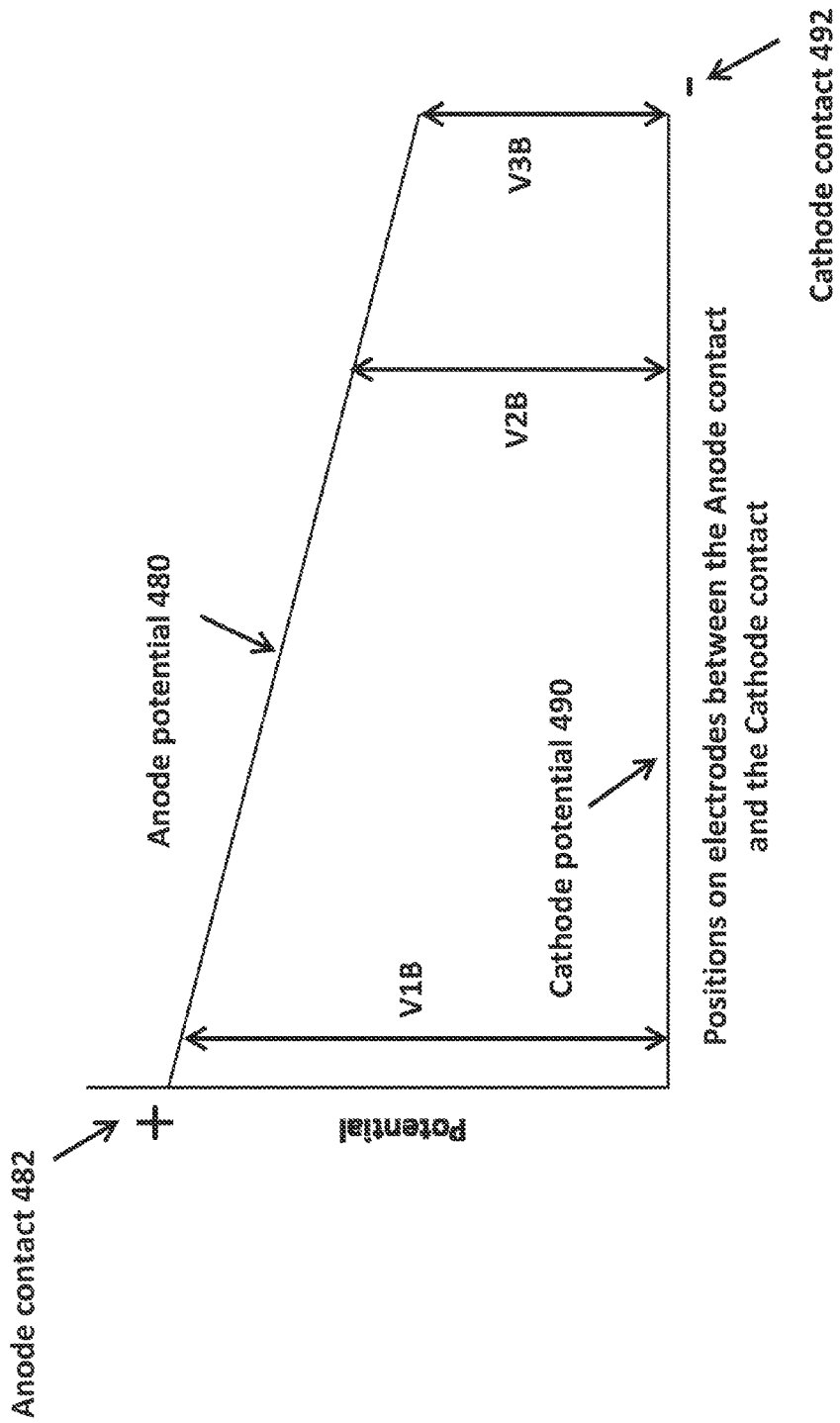

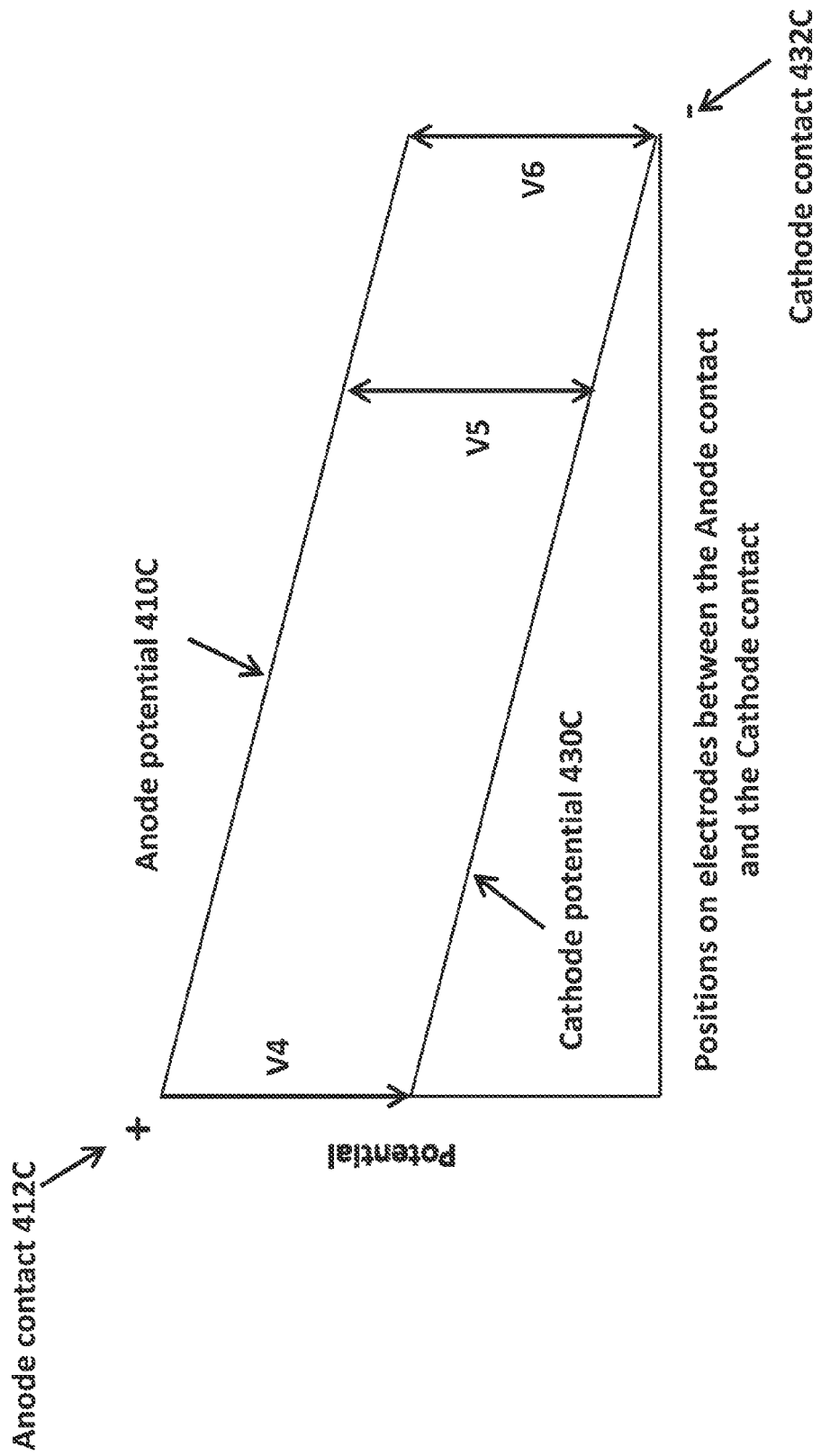

FIG. 10
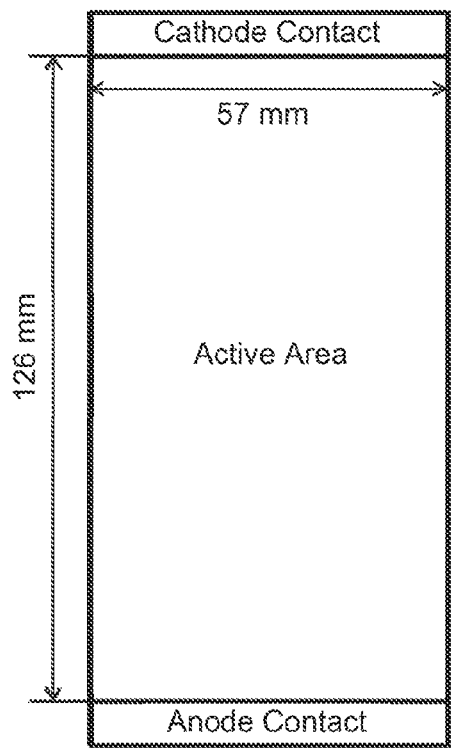
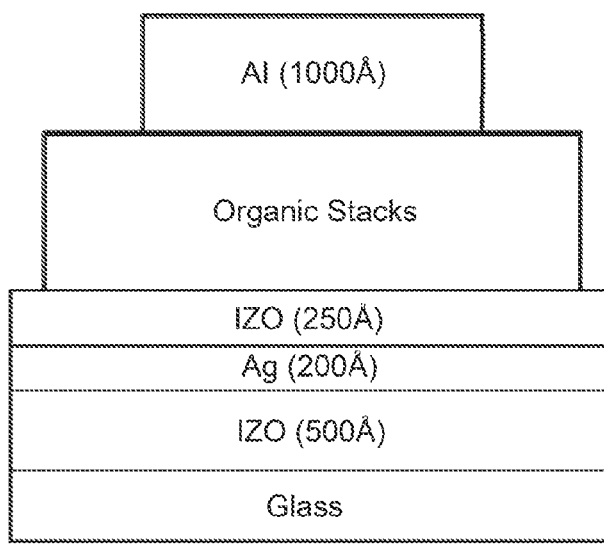
FIG. 11A
PANEL A

FIG. 11B
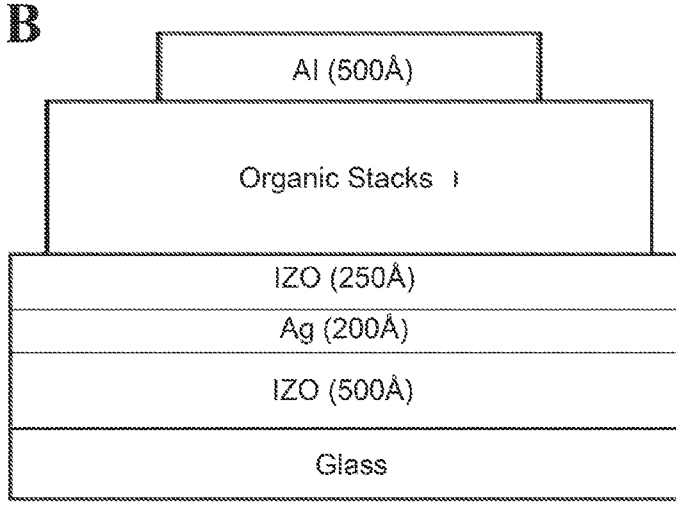
PANEL B
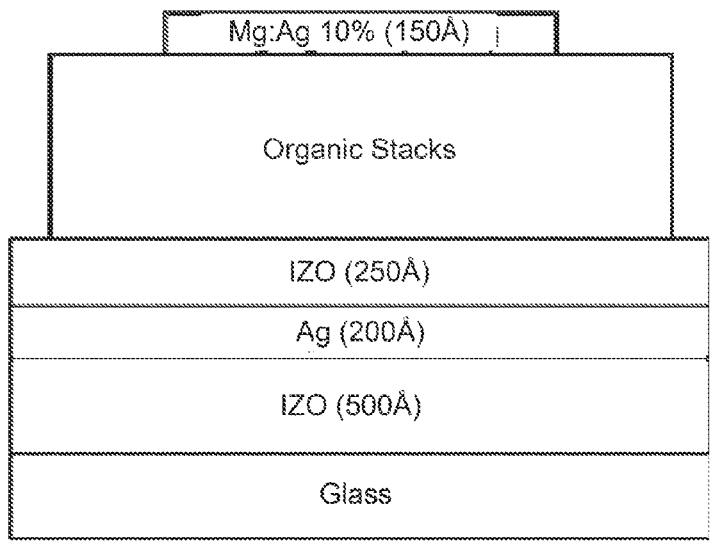
FIG. 11C
PANEL C

SYSTEM AND METHOD FOR MATCHING ELECTRODE RESISTANCES IN OLED LIGHT PANELS

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to organic light emitting devices and, more specifically, to devices that may have matched electrode resistances that provide substantially uniform luminance.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LIAM energy levels follow a different convention than work functions.

More details on OLEDs, and the definitions described above, can be found in U.S. Pat. No. 7,279,704, which is incorporated herein by reference in its entirety.

SUMMARY OF THE INVENTION

In an embodiment, a light-emitting device having improved luminance uniformity is provided. The device may include a first electrode having a first electrical sheet resistance Rs and a second electrode having a second electrical sheet resistance in the range of about 0.3 Rs 1.3 Rs. Preferably, the second electrical sheet resistance may be in the range of 0.7 Rs-1.0 Rs. An organic emissive layer is disposed between the first electrode and the second electrode. A plurality of organic light emitting devices may be arranged in series.

In an embodiment, an organic light emitting device may include a first electrode, a second electrode, and an organic emissive layer disposed between the first electrode and the second electrode. A gradient resistance of at least one of the first and second electrodes is in a current flow direction.

In an embodiment, an organic light emitting device may include a first electrode, a second electrode, and an organic emissive layer disposed between the first electrode and the second electrode. A potential difference between each of a plurality of points on the first electrode and a corresponding point on the second electrode measured in a direction substantially perpendicular to the first electrode and to the second electrode, is within 5% of each other.

Methods of fabricating organic light emitting devices are also provided. For example, in an embodiment, a device may be fabricated by obtaining a first electrode source material and disposing the material over a substrate. The substrate may be arranged at an angle θ relative to a line normal to the substrate from the first electrode material source, where 0<θ<90°. The first electrode material may be deposited onto the substrate to firm a first electrode having a non-uniform thickness.

In embodiment, fabrication of an organic light emitting device may include a plurality of layers of an electrode material that is deposited through a series of shadow masks. Each shadow mask in the series of shadow masks may have a smaller area through which the electrode material is deposited than the previous shadow mask in the series.

According to an embodiment, an organic light emitting device may be fabricated by passing a substrate through a plurality of positions in a linear deposition system. At each position, electrode material may be deposited over a substrate at a different thickness and over a different portion of an area of the substrate than at each of the other positions.

BRIEF DESCRIPTION OF THE DRAWINGS

FIG. 4A shows a view of OLED electrodes for providing an equipotential surface according to an embodiment of the present invention.

FIG. 4B shows a schematic representation of expected potentials at points between an anode and a cathode of a conventional OLED device.

FIG. 4C shows a schematic representation of expected potentials at points between an anode and a cathode of an OLED device according to an embodiment of the present invention.

FIG. 10 shows a schematic drawing of panel layout according to an embodiment of the present invention.

FIGS. 11A-C show device structures for Panels A, B and C according to an embodiment of the present invention.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
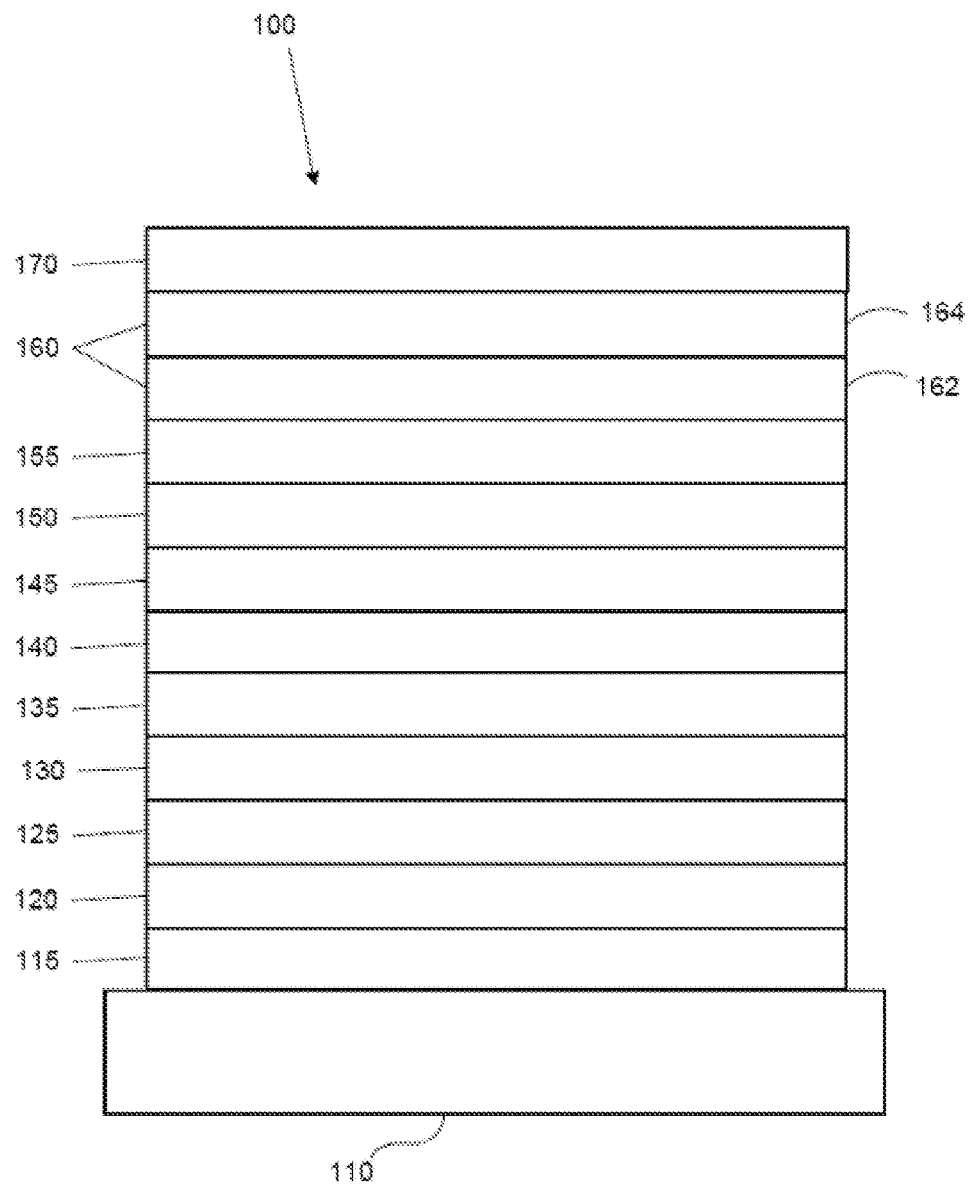
FIG. 1 shows an organic light emitting device (OLED).

FIG. 1 shows an organic light emitting device 100. The FIGs. are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 1160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
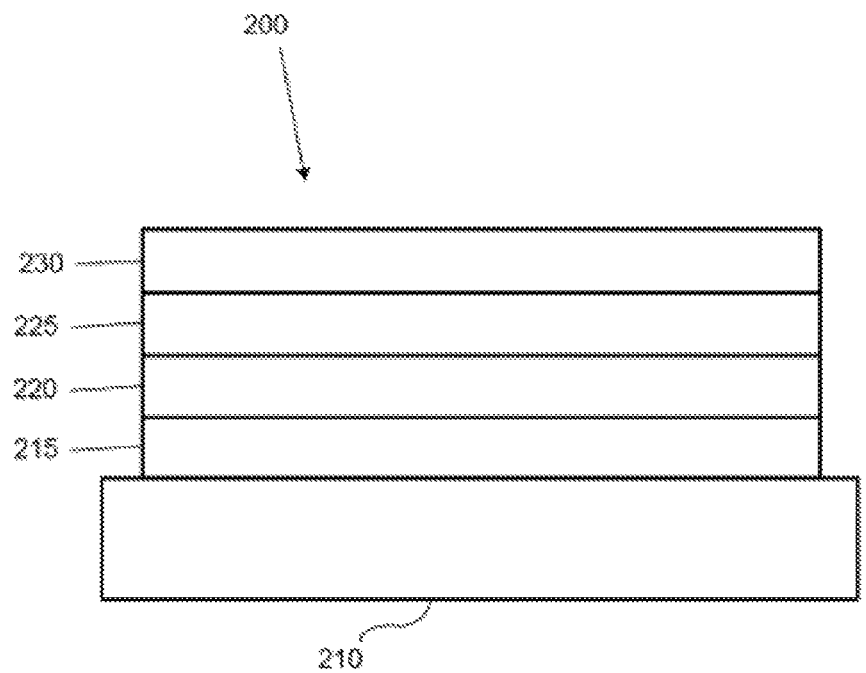
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, (preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as inkjet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both.

The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

As used herein, "luminance uniformity" refers to the ratio between the minimum luminance and the maximum luminance. Thus, a panel that has the same luminance across the panel will have a luminance uniformity of 100%. It is known that when scaling up to large size, the luminance uniformity of an OLED panel degrades across the panel. The luminance non-uniformity occurs because conventional transparent conducting oxides (TCOs), such as ITO, and IZO, have relatively high sheet resistance, varying from 10 to 100 Ω/□ (ohms/sq), which causes resistive loss, i.e. potential drop, as current flows across the panel. Luminance non-uniformity may further cause non-uniform aging, which may lead to a reduced device lifetime. One technique to address this challenge is to embed highly conductive metal bus lines on to the electrode to promote a uniform current distribution. However, the use of bus lines may reduce the fill factor of the OLED panel due to the non-emissive property of metal. In addition, the process steps are more complicated when integrating bus lines, which adds to the manufacturing cost and the total average cycle time (TACT) of manufacturing the device.

Embodiments of the present invention may provide a device that outputs light having improved luminance uniformity, e.g. >80% at 1,000 cd/m². As used herein, luminance uniformity may be used to compare the brightness of various positions of the light source, i.e. OLED panel in this invention, and does not take chromaticity into account. That is to say, optical distortion, or color variation, may exist even when the luminance uniformity is high.

Figure 3:
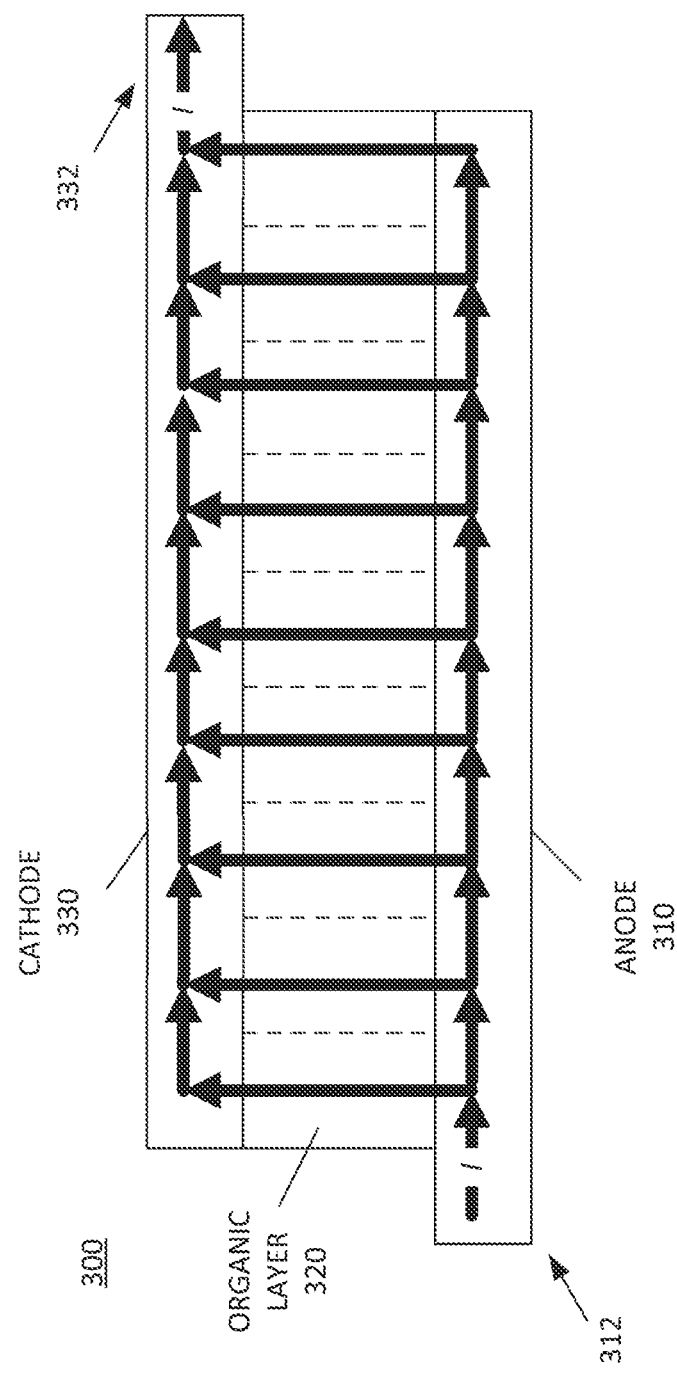
FIG. 3 shows electrical current flow through an OILED according to an embodiment of the present invention.

In some embodiments, the OLED device may have a more uniform potential drop across the two electrodes, and thus an improved luminance uniformity. This may be achieved by matching the sheet resistances of the two electrodes. FIG. 3 shows electrical current flow through OLED according to an embodiment of the present invention. The OLED device 300 may include an anode layer 310, a layer or layers of organic material 320 and a cathode layer 330. Anode and cathode drive contacts 312, 332 may be on opposite ends of the device.

In a conventional bottom-emission OLED, it is common practice to design the conductance of the cathode layer 330 to be as great as possible, which means the resistance is as low as possible. Typically, the cathode of a conventional bottom-emission OLED may be considered grounded. The highly-conductive cathode layer 330 is commonly formed from a metal. Conversely, the anode layer 310, which commonly includes ITO or a similar material, may have a greater resistance or tower conductance. By considering segments of the device (represented by dash lines) individually, each single segment may be considered as an individual OLED. The current (shown by dark arrows) may flow through one electrode contact 312 of anode 310 (e.g. the first electrode) and each of the segments of the organic stack 320 to the opposite electrode contact 332 of cathode 330 (e.g. the second electrode). In a conventional configuration, the luminance typically is greatest in the segment closest to the anode contact 312 and lowest at the segment farthest from the anode contact 312, which happens to be the segment closest to the cathode contact 332. The difference in luminance is due to a greater device voltage at the segment closest to the anode contact 312 than at the segment closest to the cathode contact 332, which is the segment farthest from the anode contact 312. As a result, conventional OLED devices have non-uniform luminance across the OLED device because of the uneven voltage across the panel.

In contrast to conventional techniques and the accepted idea of improving luminance uniformity by attempting to further reduce the resistance of the cathode layer, the inventors have increased the sheet resistance of the cathode layer 330 or portions of the cathode layer 330 to generate a more uniform potential across the OLED segments in the organic layer 320. It has been found that this unexpectedly may provide increased luminance uniformity as well as a substantial increase in fill factor. It has also been found that matching the resistances of the two electrodes in an OLED unexpectedly may provide approximately a 10% increase in luminance uniformity or more, compared to a configuration in which the resistance of one electrode is relatively high and the resistance of the other electrode is very low.

As an example, FIG. 4A shows a cross-sectional view of an OLED device according to embodiment of the present invention. The OLED device 400 may include a first electrode 410, an organic layer 420, and a second electrode 430. The first electrode 410 may be an anode layer and the second electrode 430 may be a cathode layer. The first electrode 410 may have a sheet resistance Rs. For example, the sheet resistance Rs of the first electrode may be 10-100Ω/□. The organic layer 420 may be formed as a single layer or a plurality of layers. The organic layer 420 may be formed from one or more organic materials to provide the designed light production. For ease of explanation, the organic layer 420 is shown but the details of the layer are not necessary for purposes of this discussion and are omitted. The second electrode 430 may be formed in a manner that provides a match of potential drop between any point on the first electrode 410 and a corresponding point on the second electrode 430. By selecting the resistances of the first electrode 410 and the second electrode 430 to be matched within a range of 0.30-1.30 of the sheet resistance Rs of the first electrode 410, an improved luminance uniformity of the panel may be attained. Alternatively, the sheet resistance of the second electrode may be in the range of 0.50-1.20 of Rs. Preferably, the sheet resistance of the second electrode may be in the range of 0.70-1.0 of Rs. More preferably, the sheet resistance of the second electrode may be equal to Rs.

For example, as shown in FIG. 4A, point P1 is located at (X1, Y1) on the first electrode 410, and point P1' is a corresponding point on the second electrode located at (X1', Y1') on the second electrode 430, where X1 equals X1' and Y1 equals Y1'. Electrical current may be supplied at electrode contact 412 and may disperse to all points on the first electrode 410. Similar to the current flow shown in FIG. 3, the current flow may be generally in the direction from the electrode contact 412 to the opposite electrode contact 432 on the second electrode 430. The current may pass through the organic layer 420 to the second electrode 430, and to the opposite electrode contact 432. As used herein, the electrode contact 432 is "opposite" the other electrode contact 412 because it is located on a single side of the second electrode at a location that is farthest from electrode contact 412 on the first electrode as measured across the device. The opposite electrode contact 432 may be at a reference voltage, such as ground potential.

The potential difference (voltage between the two electrodes) between point P1 on the first electrode 410 and point P1' on the second electrode 430 may be equal to V. Another point P2 located at (X2, Y2) on the first electrode 410 also may have a corresponding point P2' located at (X2', Y2') on the second electrode 430. The coordinates of each point P2 and P2' are equal, so X2 equals X2' and Y2 equals Y2'. The potential difference between point P2 and point P2' may be equal to V'.

In a conventional bottom-emission OLED, where the cathode is highly conductive, the cathode potential 490 shown in FIG. 4B may be considered as ground at any point on the plane of the cathode between the anode contact 482 and the cathode contact 492. In which case, the potential at any two points in the plane of the cathode electrode may be equal at approximately zero potential. Therefore, cathode potential 490 is flat. The anode electrode in a conventional bottom-emission OLED may have a sheet resistance that generates a potential difference between the anode and the cathode. Therefore, the potential of any two points in the plane of the anode electrode may not be equal, and the anode potential 480 is not flat. In fact, the farther a point is from the anode contact 482, the lower the potential will be at that point. As shown in FIG. 4B, the potential difference V1B (closest to the anode contact 482) is greater than the potential difference V2B (between the anode contact 482 and the cathode contact 492), which is greater than the potential difference V3B (closest to the cathode contact 492).

Conversely, as described herein, the second electrode 430 (as shown in FIG. 4A) may be engineered so that it has a sheet resistance greater than zero, and therefore, the potentials of P1' and P2' shown in FIG. 4A are different. By selecting the sheet resistance of the second electrode to match the sheet resistance of the first electrode, the difference between V1 and V2 may be reduced to have, for example less than 5% or, more preferably, less than 1% variation, and an improved luminance uniformity may be achieved. For example, as shown in FIG. 4C, the second electrode may be the cathode, and the cathode potential 430C decreases from a higher potential nearest the anode contact 412C to a minimum potential closest to the cathode contact 432C. The potential between respective points of the electrodes may be represented by the anode potential 410C and the cathode potential 430C, and may be substantially uniform. For example, the potential difference V4 closest to the anode contact 412C may be substantially equal to the potential difference V5 between the anode contact 412C and the cathode contact 432C. Similarly, both potential differences V4 and V5 may be substantially equal to potential difference V6 nearest to the cathode contact 432C. In other words, a substantially uniform potential is provided across the OLED device. The improved uniform potential between the electrodes also may lead to more uniform aging across the panels of the OLED device, thus avoiding non-uniform aging, differential coloring due to aging, local hot spots, reduced lifetime and the like. Data showing specific examples of these considerations is provided below.

The electrode contact may be positioned at single edge of the electrode. In addition, the electrode contact edge may be less than 25% of the total circumference of the electrode. In some embodiments, the contacts of opposite electrode may be positioned at approximately the farthest locations across the device. The OLED device 400 may be a transparent or top-emission OLED device in which the sheet resistance of a cathode is typically higher than a cathode in conventional bottom-emission OLED devices. Transparent or top-emission OLEDs may more readily benefit for the disclosed techniques because the engineering, e.g. adding sheet resistance, of the cathode is easier to achieve. An implementation of the OLED device 400 may have an active area greater than 50 cm$^2$. More preferably, the OLED device 400 may have an active area of at least 72 cm$^2$. In addition, a side of either the first or second electrode may be at least 2 cm. The resistance of the second electrode may be a function of the thickness of the material, usually a metal, used to fabricate the electrode. Surprisingly, in contrast to a conventional arrangement in which at least one electrode has as small a sheet resistance as possible, an arrangement as described may provide improved uniformity in luminance and potential of the device.

Figure 5:
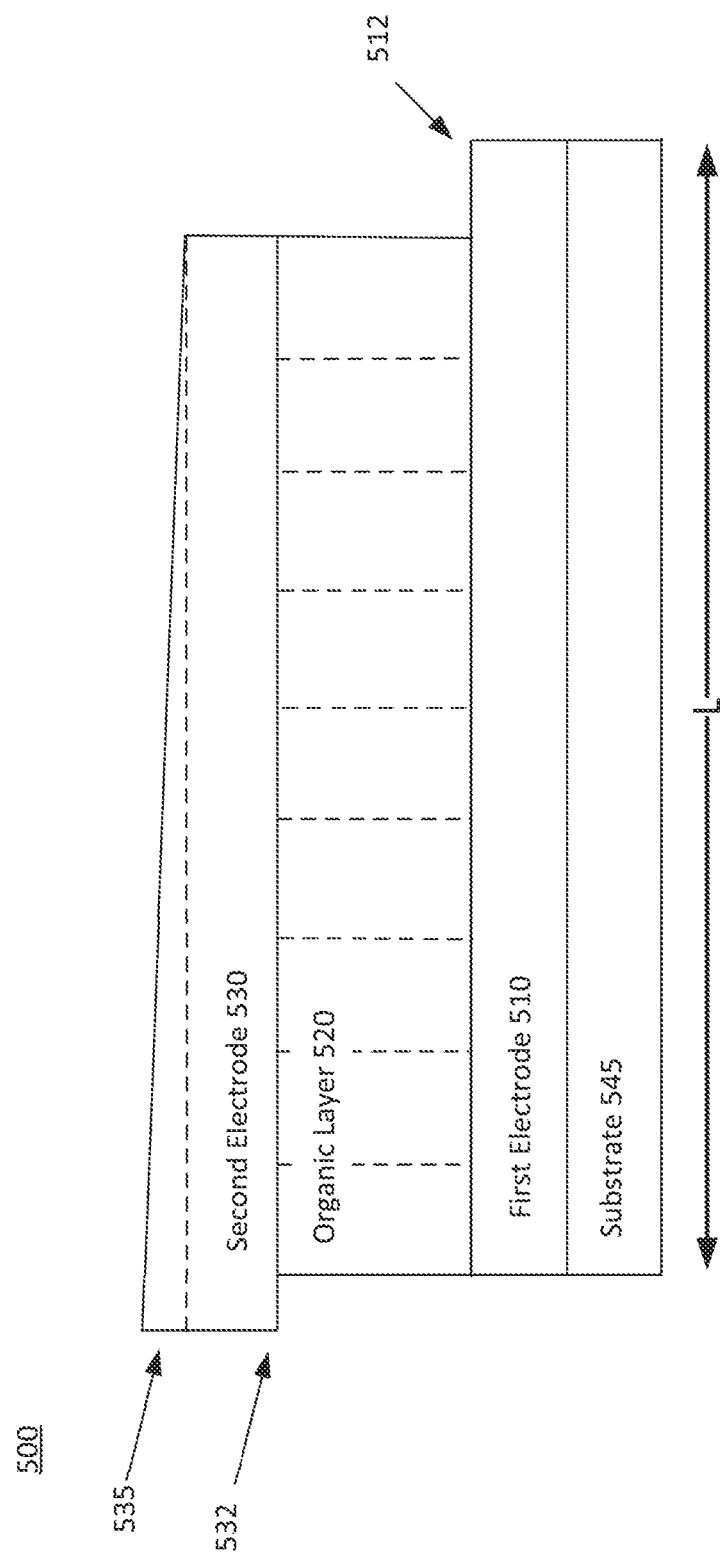
FIG. 5 shows a cross-sectional view of an OLED according to an embodiment of the present invention.

In order to achieve a uniform potential difference between the electrodes, the sheet resistance of the first electrode, second electrode or both may be manipulated by varying the electrode thickness so that an equal potential difference is maintained across the organic layer. FIG. 5 shows an implementation of an OLED device according to an embodiment of present invention. The OLED device 500 may include first electrode 510 (an anode), a second electrode 530 (a cathode), an organic emissive layer 520 disposed between the first electrode 510 and the second electrode 530, and a substrate 545. The organic emissive layer 520 may include a host and a phosphorescent dopant. For ease of explanation, only the manipulation of the second electrode will be discussed. The thickness of the second electrode 530 may be graded to a non-uniform thickness from one side to another side along the device length L. For example, the second electrode 530 may have a first thickness at a point near the electrode contact 512 and may have a second, different thickness at the opposite electrode contact 532 as shown by grading 535. The amount of material deposited on the second electrode 530 may increase, or be graded, across the device 500 length L. The resistance gradient may be in the current flow direction within the electrode. Current may be applied to the OLED device 500 at electrode contact 512 and may pass to the opposite electrode contact 532. Therefore, the graded thickness 535 and resultant non-uniform resistance of the second electrode 530 may provide a relatively uniform potential difference between the first electrode 510 and the second electrode 530. As previously discussed, this may provide improved luminance uniformity.

The described structures may be particularly preferred for top-emission and transparent OLED devices. In an embodiment, the electrodes of the OLED device may have sheet resistances that substantially match. In other embodiments, one of the two electrodes of the OLED device may have a sheet resistance that is a gradient resistance. Although the above was described with reference to the second electrode 530 having a non-uniform resistance, the disclosed implementations should not be limited to only the second electrode. It should be understood that the first electrode 510 may be formed with a non-uniform resistance instead of the second electrode.

Figure 6A:
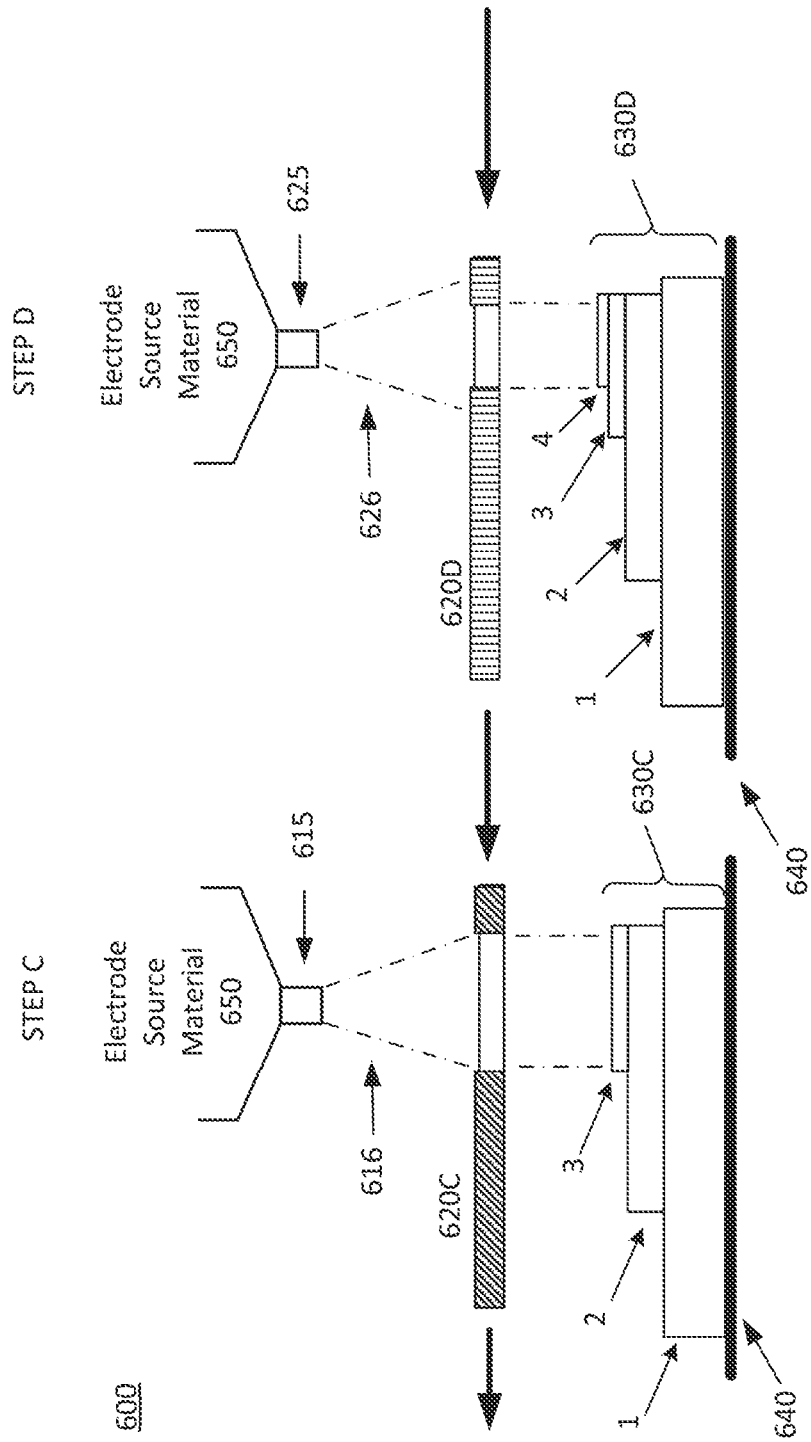
FIG. 6A provides a functional illustration of a deposition system utilizing masks for fabricating a graded electrode structure on an OLED according to an embodiment of the present invention.
Figure 6B:
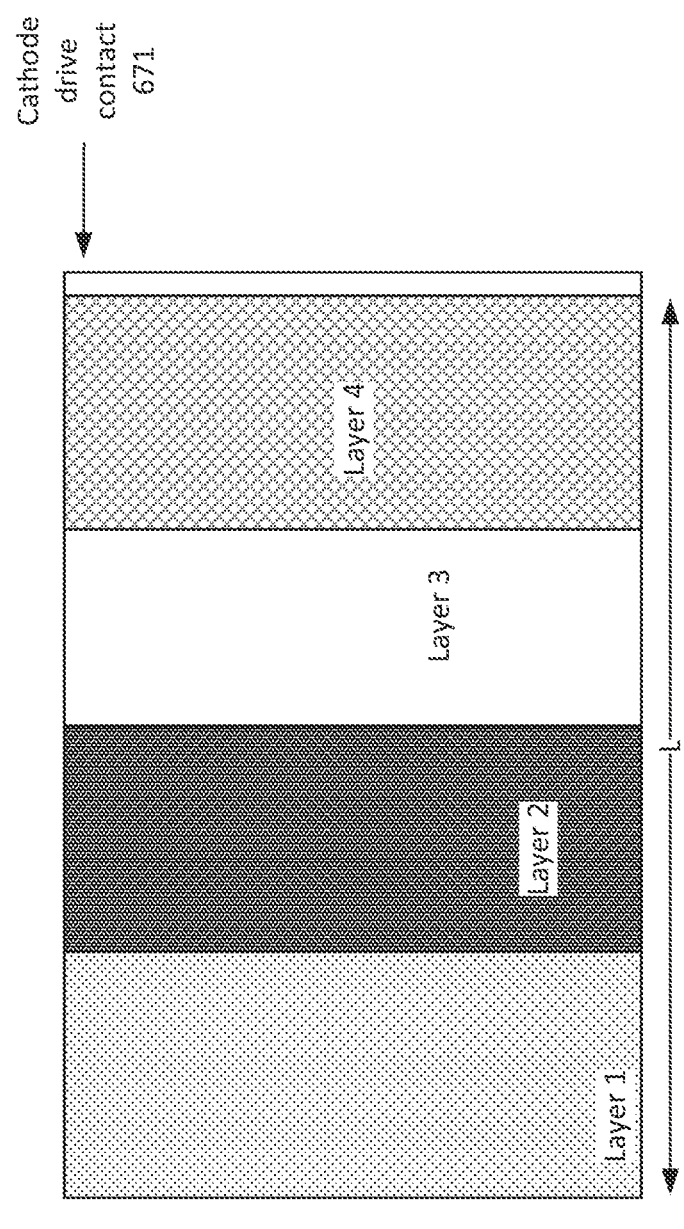
FIG. 6B shows a top view of an electrode according to an embodiment of the present invention.
Figure 7:
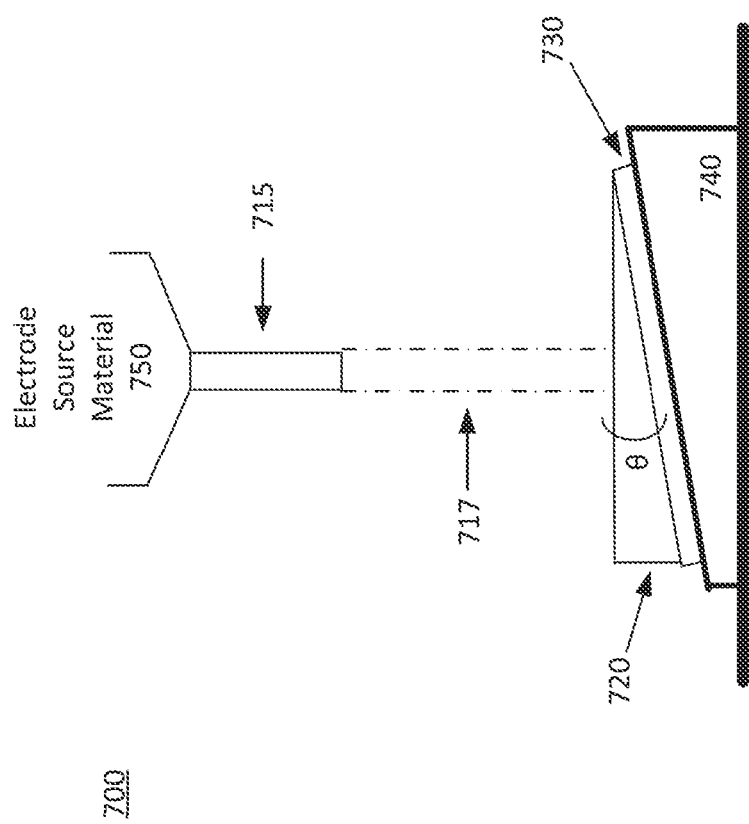
FIG. 7 shows an example of a layer deposition system for fabricating an OLED according to an embodiment of the present invention.

Examples of the techniques for fabricating the disclosed structures are illustrated in FIGS. 6A, 6B and 7. FIG. 6A provides a functional illustration of a deposition system according to an embodiment of the present invention. The deposition system 600 may utilize a series of shadow masks for fabricating a graded electrode structure for an OLED device. The system 600 may have a plurality of layers deposited at various chambers, locations, or steps in a fabrication process, such as C and D, and may include source material 650, a plurality of deposition devices 615, 625, a plurality of masks 620C, 620D, and a transport device (not shown) for moving masks from step to step for fabrication. The figure shows views of a partially-built OLED device, which includes substrate 640 and electrode 630C, 630D, respectively. At step C, mask 620C may be transported over substrate 640 with electrode 630C and the deposition device 615. At station C, layer 3 of the electrode 630C may be deposited on electrode layer 2 that was deposited at a prior step. The spray area 616 may cover the shadow mask 620C, such that the electrode source material 650 is deposited over layer 2 in the region desired to form electrode layer 3. After layer 3 is deposited, the OLED device or the masks may be moved to the configuration shown in step D. D may be configured similar to step C except that the mask 620D may be different.

Step D is shown with an OLED device that includes substrate 640 and electrode 630D. The electrode 630D may, for example, be a second electrode as shown in FIG. 5. As the OLED device is transported from step C, electrode source material 650 may be deposited by the deposition device 625 through mask 620D to form electrode layer 4 on top of layer 3 of electrode 630D. Electrode layer 4 may have a similar width as layers 1-3, but may have a different length, than electrode layers 1-3 because the mask 620D may be different from mask 620C. Layers 1-3 may have similar widths to one another, but each may have a length different from a previous layer. For example, layer 1 may have a longer length than layer 2, which may have a longer length than layer 3.

FIG. 6B shows a top view of an electrode according to an embodiment of the present invention. The electrode 670 may be formed using a process as shown in FIG. 6A or any other suitable fabrication process. The electrode 670 may be a cathode layer. The electrode 670 may have a plurality of layers 1-4, and a cathode contact 671. As shown, the area of each successive layer 1-4 of the electrode 670 may decrease, such that, for example, a layer may extend farther from the cathode contact 671 than layers disposed over that layer. The physical structure of the electrode may be thicker in the region closest to the cathode contact than the anode contact area which may be on the opposite side of the cathode contact. This layer configuration may also provide a gradient resistance in the current flow direction across the device. Finer thickness variation may be realized by increasing the number of layers. In other embodiments, anode resistance may be tuned, or matched, with respect to the cathode resistance so as to achieve equal potentials between the electrodes. Simulations discussed in the Experimental section illustrate the benefits of the illustrated arrangement. The actual physical structure of the OLED electrode may differ from the illustrated example, and may have more or less layers to provide the desired grading and gradient resistance. In an embodiment, the lengths in addition to the widths of the four layers may be different.

It will be understood that the specific example shown in FIGS. 6A and 6B is illustrative only, and other techniques may be used to fabricate an electrode with non-uniform resistance. For example, a continuous deposition process may be used in which the electrode has a continually-varying thickness, such as by means of a shadow mask that has a variable mask opening which changes over time as electrode material is deposited. Such a configuration may allow for fabrication of an electrode with a gradient thickness and, therefore, a gradient resistance. Other techniques for fabricating suitable electrodes having non-uniform resistance are also disclosed in further detail herein.

FIG. 7 shows an example of a layer deposition system for fabricating an OLED device according to an embodiment of the present invention. The layer deposition system 700 may include a deposition device 715, substrate jigs 740 and additional components. The substrate jig 740 may be designed to securely hold a substrate 730 through the deposition system 700 as it passes beneath different deposition devices, such as deposition device 715. The substrate jig 740 may be arranged to hold the substrate 730 at an angle θ relative to a line normal to the substrate from the first electrode material source. The angle θ may be between 0 to 90° (i.e., 0<θ<90°). The angle θ may be determined to allow the appropriate amount of electrode material to be deposited so the electrode 720 may have a gradient thickness and thus a gradient resistance suitable for OLED device design parameters. The substrate jig 740 with the substrate 730 may pass beneath the deposition device 715.

Generally, the deposition device 715 may apply the electrode source material 750 to a substrate 730 to form an electrode 720 having a non-uniform thickness. Of course, multiple passes beneath the deposition device 715 may also occur with the electrode source material 750 being applied in increasing layers after the substrate jig 740 has passed the spray area 717. In addition, different masks may be used during each pass of the substrate 730 under the deposition device 715. Modifications or alterations to the disclosed fabrication processes within the scope of one of ordinary skill in fabrication processes are envisioned. For example, a linear vacuum deposition system may be used, for example, to deposit source material with various thicknesses at different positions on the substrate when the substrate passes through the deposition chamber.

Benefits of the disclosed devices and structures may include a simplified contact layout that may be nearly one dimensional and the achievement of substantially uniform luminance. In addition, the disclosed structures may provide OLED devices including an OLED having a fill factor of up to 100%. The disclosed structures may also be favored in a series connection configuration.

By designing a cathode resistance to match that of the anode, it has been found that the OLED voltage may be more precisely controlled to achieve better luminance uniformity of the device, as explained herein.

Figure 8:
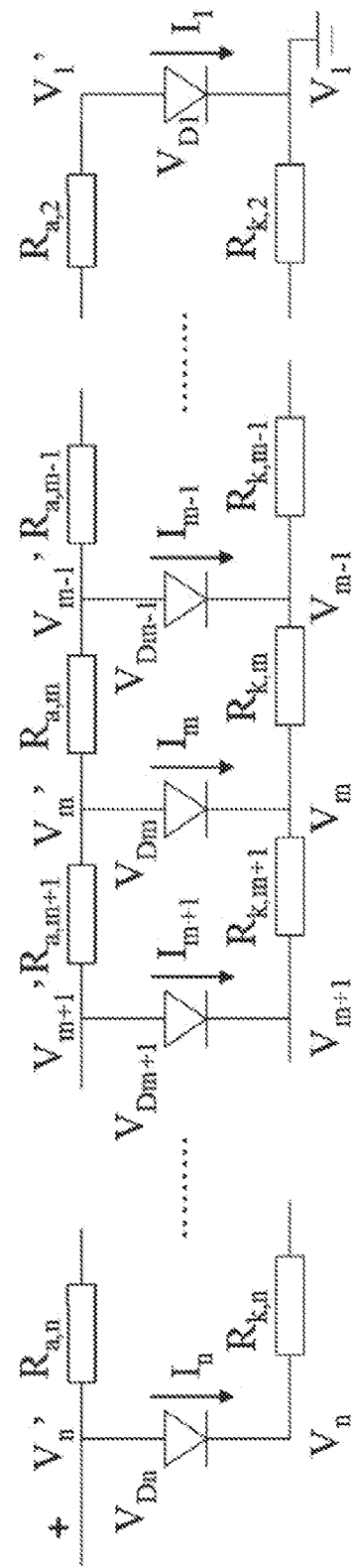
FIG. 8 shows an equivalent circuit of the OLED device shown in FIG. 3 according to an embodiment of the present invention.

An equivalent circuit of a typical OLED is shown in FIG. 8, where n is the total amount of segments being modeled, such as described with respect to FIG. 3, in represents the $m^{th}$ segment starting from the cathode contact, $R_{ai}$ (i=1, 2 . . . n) is the anode resistance of the $i^{th}$ segment, $R_{ki}$ (i=1, 2 . . . n) is the cathode resistance of the $i^{th}$ segment, $V_{Di}$ (i=1, 2 . . . n) is the device voltage of the OLED (i.e., the potential difference between the two electrodes across the organic stacks), $I_i$ (i=1, 2 . . . n) is the current flowing through the $i^{th}$ OLED segment, and $V_i$ and (i=1, 2 . . . n) are the node potentials between the adjacent anode and cathode resistors, respectively. The first OLED segment, i.e., i=1, is the one closest to the cathode contact, and the last OLED segment, i.e., i=n, is the one closest to the anode contact. By designing the cathode resistance to match that of the anode, the OLED voltage may be controlled to achieve better luminance uniformity as described below.

A current passing through the $m^{th}$ cathode resistor $I_{k,m}$, may be described as $$I_n = A_n \cdot J_n \quad \text{Eq. A}$$
$$I_{k,n} = A_n \cdot J_n$$
$$I_{k,n-1} = I_{k,n} + A_{n-1} \cdot J_{n-1} = A_n \cdot J_n + A_{n-1} \cdot J_{n-1}$$
$$\vdots$$
$$I_{k,m} = \sum_{i=m}^{n} A_i \cdot J_i$$

where $A_i$ is the area of the $i^{th}$ OLED segment and $J_i$ is the current density. The current flowing through the $m^{th}$ anode layer $I_{a,m}$, may be described with Eq. B:

$$I_{a,m} = \sum_{i=1}^{m-1} A_i \cdot J_i \quad \text{Eq. B}$$

The potential of any pair of nodes can be written as:

$$V_m = V_{m-1} + R_{k,m} \cdot \sum_{i=m}^{n} A_i \cdot J_i \quad \text{Eq. 1}$$

$$V'_m = V'_{m-1} + R_{a,m} \cdot \sum_{i=1}^{m-1} A_i \cdot J_i \quad \text{Eq. 2}$$

$$\because V'_m - V_m = V_{D,m} \quad \text{Eq. 3}$$

$$\therefore (2)-(1) \Rightarrow V_{D,m} = V_{D,m-1} + R_{a,m} \cdot \sum_{i=1}^{m-1} A_i \cdot J_i - R_{k,m} \cdot \sum_{i=m}^{n} A_i \cdot J_i$$

In the case of a typical bottom emission OLED where $R_{k,m}=0$, $$V_{D,m} = V_{D,m-1} + R_{a,m} \cdot \sum_{i=1}^{m-1} A_i \cdot J_i \quad \text{Eq. 4}$$

This means that the OLED segments closer to anode contact are always brighter than the segments that are farther away (because $V_D$ is higher), as long as the anode is resistive. This result is well known in a typical bottom emission OLED that includes an ITO anode and a highly conductive cathode.

Comparing Equations 3 and 4, it can be seen that with the introduction of a cathode resistance $R_k$, it is possible to reduce the voltage difference between neighboring OLED segments (e.g. $V_{Dm}$ and $V_{Dm-1}$). In a standard bottom emission OLED where $R_k$ is very small, the region near the anode contact has the highest luminance level. This can be explained by the difference of voltages near the anode ($V_{Dn}$) and cathode ($V_{D1}$) contacts. When the cathode resistance is very low, $V_n \approx V_1$. At the same time, $V_n' > V_1'$ because of the anode sheet resistance, therefore, $V_{Dn} = V_n' - V_n > V_1' - V_1 = V_{D1}$, resulting in a relatively very large difference in luminance of the $i^{th}$ and the $n^{th}$ OLED segments. However, when a cathode resistance is introduced, $V_n > V_1$, it may enable $V_n' - V_n = V_1' - V_1$. As a result, the luminance near the anode contact decreases, nevertheless, the total luminance uniformity may be improved.

A simple configuration described above may improve luminance uniformity for a large-area OLED device by tuning the sheet resistance of the cathode to match that of the anode. It is also possible to find an exact solution to Eq. 3 so that equal potential may be maintained across the panel and, therefore, 100% uniformity may be achieved. To do so, the voltage of each OLED segment should be the same: $V_{D,m} = V_{D,m-1}$. Equation 3 can be rewritten, for a device length L, as:

$$R_a(x) \cdot \int_0^x A(x)J(x)dx = R_k(x) \cdot \int_x^L A(x)J(x)dx, x \in [0, L]$$

where, x is the distance from the cathode contact. If the area of each segment is allowed to be the same, the current density of each OLED will be same too, i.e., A(x)=A, J(x)=J. Thus $$R_a(x) \cdot \int_0^x AJ\,dx = R_k(x) \cdot \int_x^L AJ\,dx \Rightarrow R_a(x) \cdot x = R_k(x) \cdot (L-x) \quad \text{Eq. 5}$$

When the resistances of the anode and cathode meet this requirement, there will be an equal voltage and current among all the OLED segments in the device, which may result in 100% uniformity. This implies that the closer to the anode contact, the less resistive the anode material should be and, similarly, the closer to the cathode contact, the less resistive the cathode material should be.

If the anode resistance is fixed at $R_a(x)=R_a$, the requirement for the cathode resistance to achieve an equal potential (and thus 100% uniformity) may be described as $$R_k(x) = R_a \frac{x}{L-x}, x \in [0, L] \quad \text{Eq. 6}$$

Figure 14:
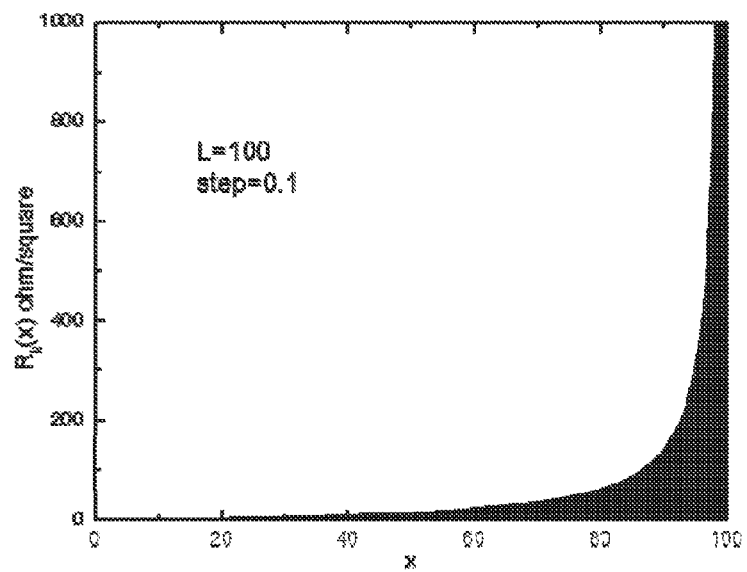
FIG. 14 shows a bar chart of cathode resistance as a function of the distance in order to achieve equal potential across the device according to an embodiment of the present invention.

For $R_a$=15 ohm/sq and L=100, the cathode resistance as a function of the distance can be plotted as shown in FIG. 14. FIG. 14 shows that the dependence of $R_k$ on distance is not linear. Instead, it has a gradual rise between zero and about 50 Ω/□ for up to 80% of the total length, and a dramatic rise from 50 Ω/□ to infinite in the last 20% length of the device. Similarly, if the cathode resistance is fixed, the anode resistance may be tuned to meet the requirement. Or, both the cathode and anode resistances may be varied at the same time.

Numerically, Eq. 6 can be written as follows:

$$R_{k,m} = R_k(m) = R_a \frac{m-1}{n-m+1}$$

Figure 15:
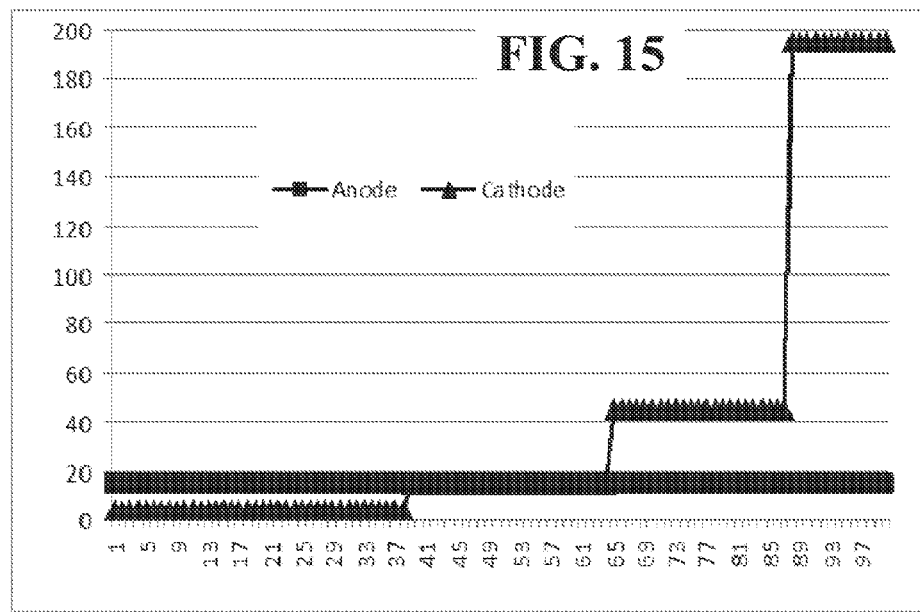
FIG. 15 shows sheet resistance distributions for both anode and cathode in a 4-segment case according to an embodiment of the present invention.

The case of a 4-segment (m=1, 2, 3, 4) OLED device with n=100 was simulated. In the simulation the anode resistance was maintained at 15 Ω/□, and the cathode sheet resistance was given 4 different values depending on the position. The resistance distributions of both electrodes are shown in FIG. 15. It can be seen that in this case, the cathode sheet resistance of the last segment is 195 Ω/□. Typically, a 20 Å thick vacuum thermal evaporated calcium has a sheet resistance of about 200 Ω/□, which meets the above requirement. A 20 Å thick Mg doped with 1% Ag has a sheet resistance of approximately 200 Ω/□. Sheet resistance may be controlled by material thickness, material type, or doping concentration. For example, Mg doped with 10% Ag is much more conductive than Mg doped with 1% Ag.

Figure 16:
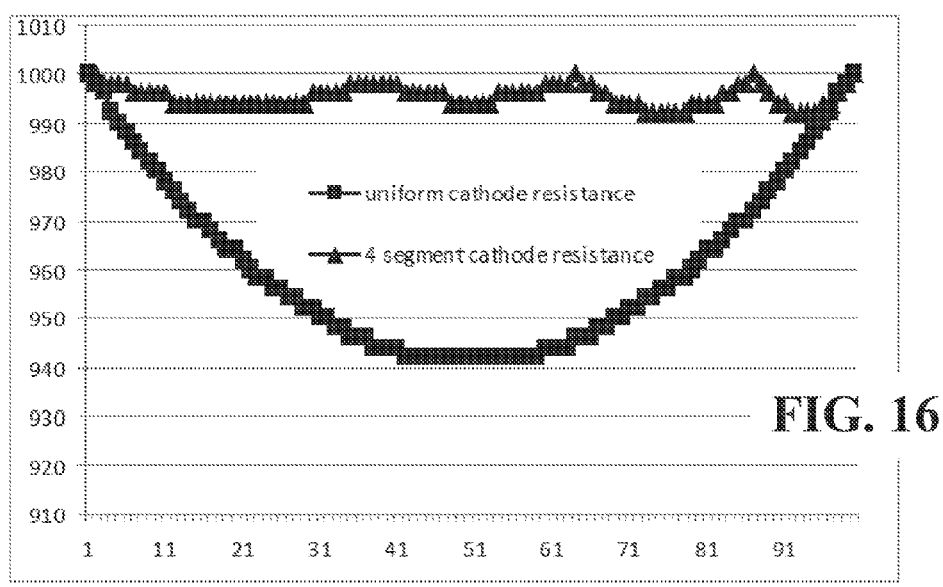
FIG. 16 shows simulated luminance distributions of an OLED panel with uniform cathode and 4-segment cathode according to an embodiment of the present invention.

The simulation results of luminance uniformity of OLED device with a uniform cathode and a 4-segment varied cathode are shown in FIG. 16. With four different cathode sheet resistance values, the non-uniformity may be reduced to 0.76%.

Figure 17:
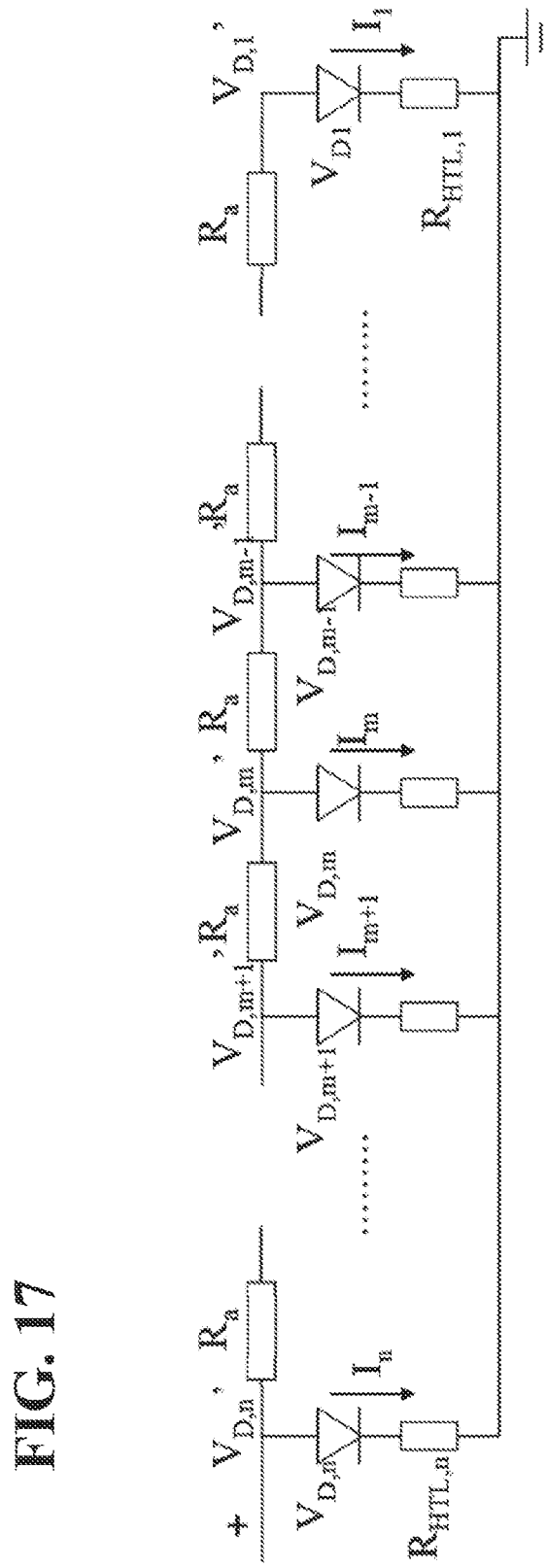
FIG. 17 shows an equivalent circuit diagram for an OLED with varied HTL thickness according to an embodiment of the present invention.

Another technique to obtain matching resistance between the electrodes is to tune the OLED turn-on resistance to achieve luminance uniformity. For example, it is known that the thickness of the hole transporting layer (HTL) has an impact on the device voltage. Therefore, by changing HTL thickness, the OLED turn-on resistance may be changed. An equivalent circuit diagram is illustrated in FIG. 17, where the cathode has a zero potential and the anode has a uniform resistance. For each OLED segment, the resistance due to the thick HTL, $R_{HTL}$, can be extracted from the device.

In this case, $$V'_{D,m} = V'_{D,m-1} + R_a \cdot \sum_{i=1}^{m-1} A_i J_i$$

$$V'_{D,m} = V_{D,m} + A_m J_m \cdot R_{HTL,m}$$

$$\Rightarrow V_{D,m} + A_m J_m \cdot R_{HTL,m} = V_{D,m-1} + A_m J_m \cdot R_{HTL,m-1} + R_a \cdot \sum_{i=1}^{m-1} A_i J_i$$

For a uniform panel, $$J_i = J$$

$$V_{D,m} = V_D$$

Which provides:

$$AJ \cdot R_{HTL,m} = AJ \cdot R_{HTL,m-1} + AR_a \cdot mJ \Rightarrow R_{HTL,m} = R_{HTL,m-1} + mR_a$$

This provides the relationship of the adjacent HTL resistance. Therefore, by changing the thickness of the HTL for each segment, the voltage of each OLED segment may be tuned to be equal across the panel. Note that, any means that controls or modifies the OLED turn-on resistance may be applied here, such as varying thickness of HIL, varying the ETL thickness, or any other suitable modification to the structure of the device.

Fabrication techniques similar to that described with respect to FIG. 7 may be used to form a gradient thickness of an electrode, a transport layer, or any other layer or layers, across the panel. For example, the substrate may be tilted during deposition from electrode and/or transport layer material sources, causing more materials of the electrode and/or of the transport layer to be deposited closer to one end of a substrate than the other. A graded thickness also may be achieved in a linear vacuum deposition system where the materials may be deposited with various thicknesses at different positions on the substrate when the substrate passes through the deposition chamber. Other techniques, such as those disclosed elsewhere herein, also may be used to fabricate an electrode having a gradient thickness.

EXPERIMENTAL

To determine the impact of this cathode resistance, a computer simulation program was developed to numerically calculate the voltage, current and luminance for each OLED segment, based on the equivalent circuit in FIG. 8. The first step of this simulation is to calculate the voltage and current of the first OLED under a target luminance, e.g. 1,000 cd/m$^2$. This can be done by using current, voltage, and luminance data measured from an equivalent small-area OLED pixel. The only assumption in the simulation is that the overall current that flows in and out of the whole OLED "string" is the same at both ends, and we set its initial value as n×I$_1$. With this current and I$_1$ known, the potential of the next segment may be calculated, and thus the current and luminance. This process is repeated until the input current at the anode contact is acquired. If this input current is the same as the output current at the cathode contact, then the solution is found. Otherwise this process is repeated until the input and output currents are the same.

Figure 9:
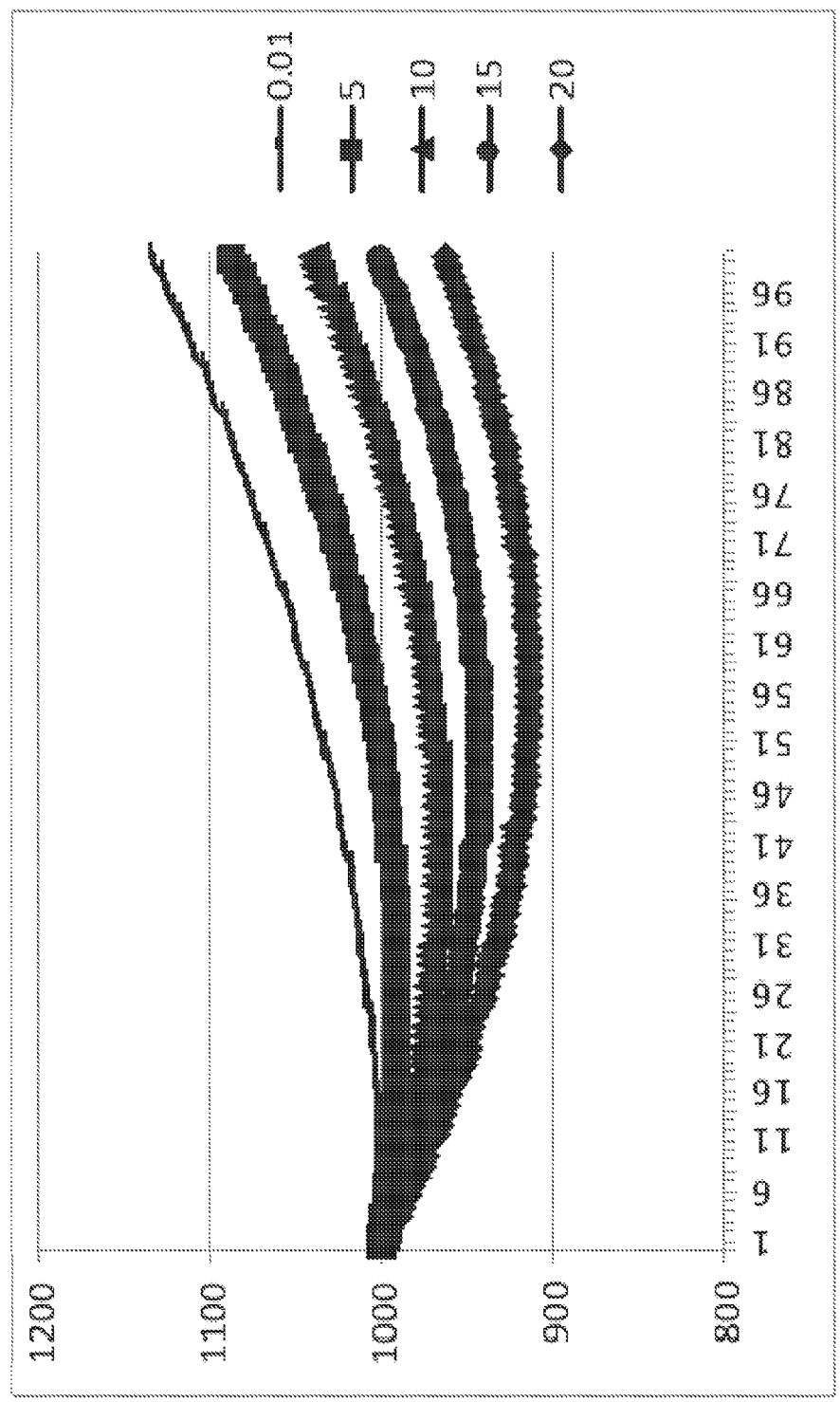
FIG. 9 shows simulation results of luminance distribution in 1-D OLED device with uniform cathode according to an embodiment of the present invention.

Firstly, uniform resistance was introduced to cathode. The simulation is performed on bottom-emission OLED. The sheet resistance of ITO is 15 Ω/□. The cathode sheet resistance is varied from 0.01 Ω/□ to 20 Ω/□. The OLED device is 2 cm long in one dimension where two electrode contacts were placed at opposite ends. The device is divided into 100 segments (i.e., n=100 in FIG. 8), with the first segment close to cathode and the last to anode. The target luminance immediately adjacent to the cathode contact at n=1 is set at 1,000 cd/m$^2$. The simulation results are plotted in FIG. 9, where the luminance levels across the OLED device from cathode to anode are calculated for different cathode sheet resistances. As can be seen from the plot, when introducing cathode resistance, the luminance near the anode contact (n=100) decreases.

IR loss, power efficacy, and average luminance of the device with a cathode resistance present were also calculated. The results are summarized in Table 1. For a 2 cm, one-dimensional OLED device, with highly conductive cathode ($R_k$=0.01Ω/□), the luminance uniformity of the panel, defined as $L_{min}/L_{max}$, is 88.2%. With proper tuning of the cathode resistance, the luminance uniformity is improved as $R_k$ increases to $R_k$=20Ω/□. In particular, when the cathode and anode resistance are the same, i.e., $R_k$=$R_a$=15Ω/□, uniformity has an improved value of 94.2%. Notably, even when additional resistance is introduced in the device, the total IR loss is still very small, only 1.34% when $R_k$=15Ω/□. Since the resistance of the cathode is designed to be the same as that of the anode, the additional power loss due to introducing a matched cathode resistance is the same as that of the anode. Thus the total power loss may be no more than twice the power loss expected for a zero cathode resistance, which typically is a relatively very small number (0.71% in this example). However, if the cathode resistance increases beyond a threshold, for example to $R_k=30\Omega/\square$ in the present configuration, the luminance uniformity may be expected to decrease. Thus it is expected that there is an optimized value or value range for the cathode resistance so that a lowest non-uniformity may be achieved. It has been found that this occurs when both resistances are within a small fraction of one another, and preferably $R_k=R_a$.

From the calculation above, it has been shown that by matching the resistance of two electrodes so as to achieve equal potential drop across the panel, the luminance uniformity of the OLED device may be improved.

TABLE 1

Device performance with different cathode resistance.

| Rk [ohm/sq] | uniformity [%] | Efficacy [lm/W] | IR loss [%] | Average Luminance [cd/m²] |
|---|---|---|---|---|
| 0.01 | 88.2 | 65.79 | 0.71 | 1045 |
| 5 | 91.2 | 65.81 | 0.94 | 1014 |
| 10 | 93.1 | 65.84 | 1.15 | 986 |
| 15 | 94.2 | 65.86 | 1.34 | 961 |
| 20 | 91.4 | 65.87 | 1.52 | 937 |
| 30 | 86.2 | 65.9 | 1.85 | 894 |

In a further test, three OLED panels with the layout shown in FIG. 10 were fabricated. The anode and cathode electrodes are placed on the opposite single edges of the panel. The dimension of the panel is 57 mm×126 mm, which yields an active area of 72.1 cm². Device structures of the three panels are shown in FIGS. 11A-C. All three OLED panels include the same anode structure (500 Å ITO/250 Å Ag/200 Å ITO) and the same organic layer stack, but different cathodes. Panel A (FIG. 11A) includes a 1000 Å Al layer; Panel B (FIG. 11B) includes a 500 Å Al layer; and Panel C (FIG. 11C) includes a 150 Å layer of Mg doped with 10% Ag. The sheet resistances of these electrodes measured from four-point probe sheet resistance meter are summarized in Table 2. Both Panels A and C have one electrode that is more conductive than the other. Panel B has two electrodes with similar sheet resistances. Panel A has the most conductive cathode among all three panels.

TABLE 2

Summary of sheet resistances of the electrodes used in Panel A, B and C.

| | IZO/Ag/IZO 500/250/200 Å | Al 1000 Å (Panel A) | Al 500 Å (Panel B) | Mg:Ag 10% 150 Å (Panel C) |
|---|---|---|---|---|
| Sheet Resistance [ohm/sq] | 2.1 | 0.7 | 1.9 | 22.2 |

Figure 12:
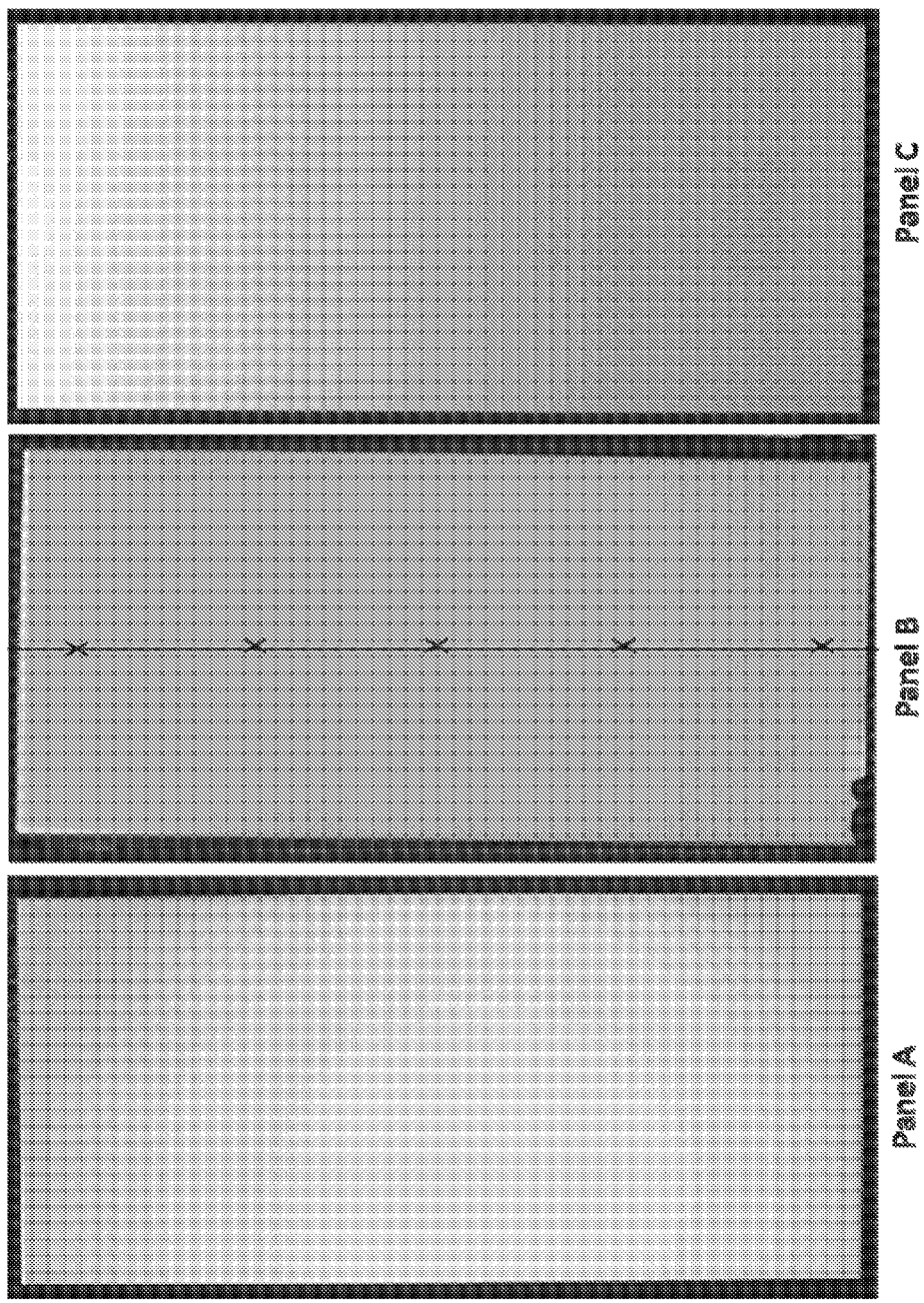
FIG. 12 shows a photo-like image of Panels A, B and C according to an embodiment of the present invention.
Figure 13:
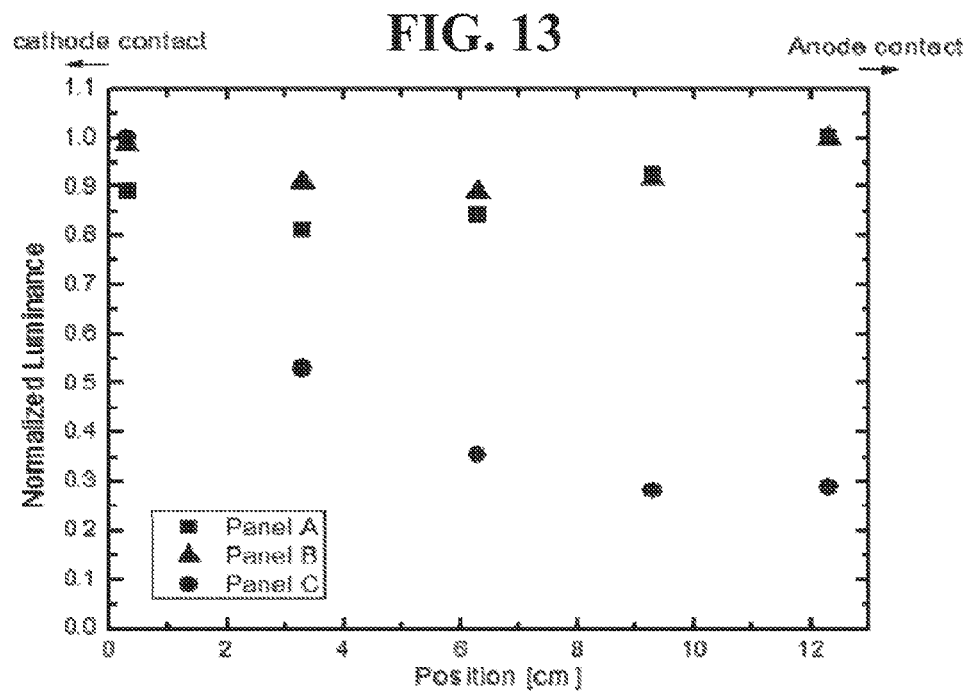
FIG. 13 shows a normalized luminance distribution of Panels A, B and C according to an embodiment of the present invention.

Photo-like images of the three Panels are shown in FIG. 12. Luminances were measured on each panel at 5 spots along the center line (indicated in FIG. 12), using a luminance meter at normal incidence. All three panels were driven at 1.8 mA/cm². The normalized luminance as a function of position of all three panels is shown in FIG. 13. The luminance uniformity is defined as $L_{min}/L_{max}$, the ratio between the minimum and the maximum luminance. The luminance uniformity of Panel A is 81%, Panel B 89%, and Panel C 28%, is apparent that even though the cathode of Panel A has a lower sheet resistance than that of Panel B, Panel B demonstrates a 10% higher luminance uniformity than Panel A. The cathode of Panel C has the poorest conductivity among the three and also not comparable with its anode, therefore, Panel C has the lowest uniformity. This demonstrates the surprising result that the luminance uniformity of a large-area. OLED panel may be improved by adding resistance to cathode to match the resistances of anode.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. An organic light emitting device, comprising:
   a first electrode;
   a second electrode; and
   an organic emissive layer disposed between the first electrode and the second electrode;
   wherein, for each of a plurality of points on the first electrode, the potential difference between the point on the first electrode and a corresponding point on the second electrode, is within 5% of the potential difference between each of the other plurality of points on the first electrode and a corresponding point on the second electrode;
   wherein, for each point on the first electrode, the point and the corresponding point on the second electrode lie on a line that is substantially perpendicular to the first electrode and to the second electrode.

2. The device of claim 1, wherein each potential difference is approximately equal to each of the other plurality of points on the first electrode and a corresponding point on the second electrode.

3. The device of claim 1, wherein each potential difference is within about 1% of each of the other plurality of points on the first electrode and a corresponding point on the second electrode.

4. The device of claim 1, wherein the first electrode has an electrode contact disposed on a single edge of the first electrode.

5. The device of claim 4, wherein the electrode contact edge is less than about 25% of the total circumference of the first electrode.

6. The device of claim 1, wherein an electrode contact for the first electrode is on a single edge of the first electrode, and a contact for the second electrode is on a single edge of the second electrode that is opposite the electrode contact for the first electrode.

7. The device of claim 1, wherein at least one of the first and second electrodes has a gradient resistance where the gradient is in a current flow direction.

8. The device of claim 7, wherein the electrode having a gradient resistance further has an electrical contact and the electrical contact is at the end with the lowest resistance.

9. The device of claim 1, wherein the device has at least one dimension of at least 2 cm.

10. The device of claim 1, wherein the device has at least one dimension of at least 10 cm.

11. The device of claim 1, wherein an active area of the device is at least 50 cm2.

12. The device of claim 1, wherein an active area of the device is at least 72 cm2.

13. The device of claim 1, further comprising:
a transport layer disposed between the first electrode and the second electrode, the transport layer having a non-uniform thickness.

14. The device of claim 1, further comprising an electrode contact for a first electrode located on a single edge of the first electrode, and an electrode contact for the second electrode located on a single edge of the second electrode, wherein the two electrode contacts are located at approximately the farthest locations from one another.

15. The device of claim 1, wherein the device outputs at a luminance uniformity greater than 80% at 1,000 cd/m2.

16. The device of claim 1, wherein the device has a 100% fill factor.

* * * * *